United States Patent [19]

Green et al.

[11] 4,400,410

[45] Aug. 23, 1983

[54] COATING INSULATING MATERIALS BY GLOW DISCHARGE

[75] Inventors: Geoffrey W. Green, Malvern; Alan H. Lettington, Worcester, both of England

[73] Assignee: National Research Development Corporation, London, United Kingdom

[21] Appl. No.: 292,432

[22] Filed: Aug. 14, 1981

[30] Foreign Application Priority Data

Aug. 21, 1980 [GB] United Kingdom ................. 8027277

[51] Int. Cl.³ ............................................. C23C 11/00
[52] U.S. Cl. ...................................... 427/39; 427/38; 204/164
[58] Field of Search ..................... 427/38, 39; 204/164, 204/173

[56] References Cited

U.S. PATENT DOCUMENTS 3,473,959 10/1969 Ehinger et al. ........................ 427/39
4,060,660 11/1977 Carlson et al. ........................ 427/39
4,140,814 2/1979 Hynecek ................................ 427/39
4,142,004 2/1979 Hauser et al. ......................... 427/39
4,173,661 11/1979 Bourdon ............................... 427/39

FOREIGN PATENT DOCUMENTS 2736514 2/1978 Fed. Rep. of Germany ........ 427/39

Primary Examiner—John H. Newsome
Attorney, Agent, or Firm—Cushman, Darby & Cushman

[57] ABSTRACT

Coatings of hard carbon, silicon, or germanium are applied to electrically insulating materials in a D.C. glow discharge chamber. Initiation and maintenance of a glow discharge is ensured by using a cathode of larger area than the material to be coated. For example the cathode may be twice the diameter of the material to be coated. Materials capable of being coated include zinc sulphide, zinc selenide, silica, and glass. The gases used are hydrocarbon e.g. butane, methane, etc. for carbon coatings; silane for silicon coatings; and germane for germanium coatings.

25 Claims, 2 Drawing Figures

COATING INSULATING MATERIALS BY GLOW DISCHARGE

This invention relates to the deposition of coatings on insulating materials using glow discharge.

Glow discharge deposition is known process in which ions form a plasma to strike a cathode and gradually form a layer. The plasma is generated in a low pressure gas in a chamber. For example silicon layers may be deposited from a silane gas plasma, and carbon layers grown from a hydro-carbon plasma.

Both RF and DC power supplies have been used to provide the necessary glow discharge when growing layers on an electrically conducting substrate.

To grow e.g. carbon on insulating substrates it had been considered necessary to use RF excitation of the gas to form the plasma because an electrical insulating cathode substrate would prevent initiation of the glow discharge.

A known process for growing amorphous carbon on glass substrates is described in U.S. Pat. No. 4,060,660. An essential feature of that patented process is the heating of the substrate above 300° C. Unfortunately such heating may be undesirable, for example the glass may suffer decomposition at its surface and the physical and electrical properties of the carbon layer are temperature dependent.

According to the present invention a method of depositing coatings on an insulating material substrate by D.C. glow discharge includes the step of providing a cathode of substantially larger area than the substrate, whereby the exposed area of the cathode serves to maintain a glow discharge and dark space above the insulating substrate in a flow discharge chamber.

Apparatus for carrying out the method of this invention comprises a chamber capable of being evacuated by a vacuum pump, supplies of a suitable gas, a cathode having a larger surface area than a substrate to be coated, and a D.C. power source. The ratio of cathode to substrate radii may be about 1.5 or greater.

The substrate may be an electrically insulating material such as a glassy or a crystalline material. For example the substrate may be zinc sulphide, zinc selenide, silica, rock salt, or glass.

The coatings may be for example hard diamond-like carbond deposition from a gas such as butane, methane, acetylene, etc.; or silicon from silane gas; or germanium from germane gas.

Thin substrates may be laid directly on an electrically conducting cathode. For thicker substrates the cathode may be recessed e.g. so that the upper surface of cathode and substrate are approximately coplanar.

Prior to deposition the substrate may be cleaned by argon ion bombardment.

The cathode may incorporate heaters and/or coolers.

The invention will now be described, by way of example only, with reference to the accompanying drawings of which:

Figure 1:
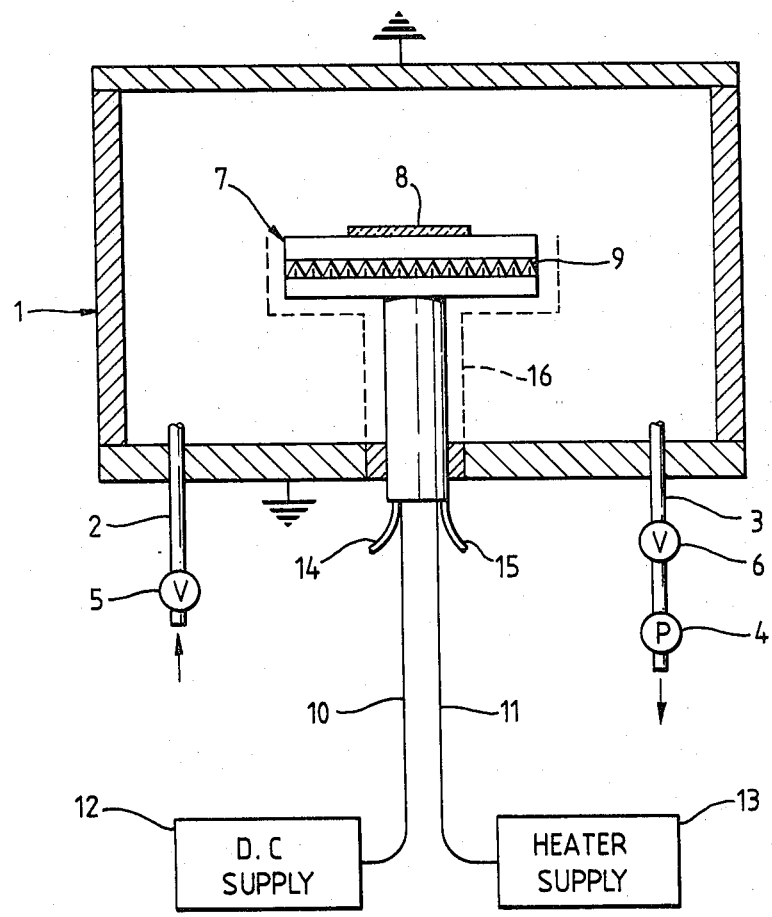
FIG. 1 shows apparatus for coating an electrically insulating substrate.
Figure 2:
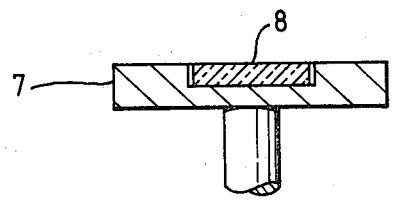
FIG. 2 shows an alternative cathode used when coating thick substrates.

As shown in FIG. 1 a chamber 1 has a gas inlet port 2, and an outlet port 3 connected to a vacuum pump 4. Valves 5, 6 control flow through these ports 2, 3. Inside the chamber 1 is a cathode 7 which carries a substrate 8, e.g. a flat plate or lens. The cathode 7 may contain a heater 9 and/or cooler and is electrically insulated from the chamber 1. In one example the cathode was 120 mm diameter and the substrate was 60 mm diameter. Electrical leads 10, 11 pass from the cathode 7 to a DC power supply 12 and from heater 9 to heater supply 13 respectively, and pipes 14, 15 to a cooler supply (not shown) outside the chamber 1. As earthed shield 16 is fitted about the cathode 7 to confine the discharge. The substrate 8 may be recessed within the cathode 7 as shown in FIG. 2.

Operation to coat the substrate 8 is as follows. The chamber 1 is evacuated to about $10^{-4}$ Torr. or lower to remove air and contaminants. Argon gas in bled into the chamber 1 whilst the pump 6 is throttled down to give a pressure of about $10^{-1}$ to $10^{-2}$ Torr. typically 0.5 Torr.

A D.C. voltage of about $-2$ kV is applied to the cathode 7 causing initiation of a glow discharge at the unshielded areas of the cathode 7, flow of electrons reduces the positive charge accumulation at the substrate. Argon ions from the plasma thus created, strike the substrate 8 to clean its surface. Typically 10 minutes of argon ion bombardment is used.

Whilst maintaining the glow discharge, the argon supply is stopped and a hydrocarbon gas admitted into the chamber 1. This gas may be butane, methane, acetylene, etc. at a pressure of $10^{-1}$ to $10^{-2}$ Torr. and forms a hydro-carbon plasma. A layer of hard diamond-like carbon is formed by carbon atoms and ions striking the negatively charged substrate 8 where they gradually build up a layer of the required thickness. Typically a 1 $\mu$m thick layer is formed in about 1 hour.

When the layer is fully grown the D.C. supply is stopped, the vacuum inside the chamber is released, and the substrate removed.

Heating of the substrate up to about 250° C. prior to deposition may be used to enhance bonding. When depositing carbon layers the temperature should not reach 300° C. or more otherwise infra red absorbing graphitic carbon is deposited.

Silicon and germanium may be deposited in a manner similar to that for carbon using silane and germane respectively.

Multi-layer coatings may be formed by the apparatus shown in the drawings, by changing the gas in the chamber whilst maintaining the glow discharge. For example silicon and germanium layers may be grown in a D.C. glow discharge using the gasses silane and germane, respectively.

For some materials such as zinc sulphide a thin, e.g. about 1,000 Å, layer of silicon may be deposited to form a bonding layer for subsequent deposition of the carbon.

As described in co-pending British Application No. 50 27,279 substrates of germanium and silicon may be coated with a thin layer of hard carbon by D.C. glow discharge techniques. The present technique may be used to grow thick insulating layers on conducting substrates.

Some advantages of carbon coatings are their transparency at infra-red radiation wavelengths, their extreme hardness and their chemical durability.

We claim:

1. A method of depositing coatings on an electrically insulating material substrate in a glow discharge chamber supplied with D.C. electrical power wherein the substrate is mounted on an electrically conducting cathode of larger area than the substrate whereby the exposed area of the cathode serves to maintain a glow discharge and dark space above the substrate.

2. The method of claim 1 wherein the coating is infra red transparent hard carbon deposited from a hydrocarbon gas.

3. The method of claim 1 wherein the coating is silicon deposited from silane gas.

4. The method of claim 1 wherein the coating is germanium deposited from germane gas.

5. The method of claim 1 wherein the substrate is heated prior to depositing the coating.

6. The method of claim 1 wherein the substrate is cleaned by ion bombardment prior to depositing the coating.

7. The method of claim 1 wherein at least two layers of different materials are deposited on the substrate.

8. An apparatus for depositing a coating on an electrically insulating substrate, comprising:
 a vacuum chamber;
 an anode structure within said vacuum chamber;
 means for providing a vacuum condition in said chamber;
 means for supplying a gas into said chamber;
 a cathode structure, within said chamber, having a recessed surface for carrying said substrate to be coated, said cathode structure having a substantially larger area than said substrate so that exposed areas of said cathode structure maintain a glow discharge and a dark space above said substrate while D.C. power is applied to said anode and cathode structures; and
 means for supplying D.C. power to said anode and cathode structures.

9. Apparatus as claimed in claim 8 wherein the cathode structure includes means for controlling its temperature.

10. An apparatus for depositing a coating on an electrically insulating substrate, comprising:
 a vacuum chamber;
 an anode structure within said vacuum chamber;
 means for providing a vacuum condition in said chamber;
 means for supplying a gas into said chamber;
 a cathode structure, within said chamber, for carrying said substrate to be coated, the cathode structure having a substantially larger area than that of said substrate so that exposed areas of said cathode structure maintain a glow discharge and a dark space above said substrate while D.C. power is applied to said anode and cathode structures;
 a grounded shield surrounding said cathode structure for confining the glow discharge; and
 means for supplying D.C. power to said anode and cathode structures.

11. An apparatus according to claim 10 wherein said cathode structure comprises means for controlling its temperature.

12. A substrate having a surface coated with a first thin bonding layer of silicon and a second layer of infra red transparent hard carbon formed by the following method steps:
 mounting the substrate on an electrically insulating cathode of larger area than the substrate; and
 applying D.C. power to produce a glow discharge, the exposed area of the cathode serving to maintain glow discharge and a dark space above the substrate.

13. A substrate as claimed in claim 12 wherein the substrate material is zinc sulphide.

14. A substrate as claimed in claim 12 wherein the substrate material is zinc selenide.

15. A coated substrate formed in a glow discharge chamber in accordance with the following fabrication steps:
 providing an electrically conducting cathode within a chamber of larger area than that of the substrate;
 mounting the substrate onto the cathode thereby covering a portion of the cathode and leaving a portion of the cathode exposed;
 substantially evacuating any air from within the chamber;
 admitting into the chamber a gas containing silicon molecules;
 applying a D.C. voltage to the cathode causing a glow discharge at the exposed portion of the cathode, the flow of electrons during the glow discharge reducing any positive charge accumulation at the substrate, thereby forming a thin bonding layer of silicon on the substrate;
 removing the gas containing silicon molecules from the chamber;
 admitting a hydrocarbon gas into the chamber;
 maintaining the temperature of the substrate to less than 300° C.; and
 applying a D.C. voltage to the cathode causing a glow discharge at the exposed portion of the cathode, the flow of electrons during the glow discharge reducing any positive charge accumulation at the substrate, thereby forming a thin bonding layer of silicon on the substrate;
 removing the gas containing silicon molecules from the chamber;
 admitting a hydrocarbon gas into the chamber;
 maintaining the temperature of the substrate to less than 300° C.; and
 applying a D.C. voltage to the cathode causing a glow discharge at the exposed portion of the cathode, the flow of electrons during glow discharge reducing any positive charge accumulation at the substrate, thereby forming a coating on the substrate of infra red transparent hard carbon.

16. A substrate formed according to the fabrication steps of claim 15 wherein the substrate comprises zinc sulphide.

17. A substrate formed according to the fabrication steps of claim 15 wherein the substrate comprises zinc selenide.

18. A method of depositing a coating on an electrically insulating material substrate in a glow discharge chamber comprising the steps of;
 providing an electrically conducting cathode, within the chamber, of larger area than that of the substrate;
 mounting the substrate onto the cathode thereby covering a portion of the cathode and leaving a portion of the cathode exposed;
 substantially evacuating any air from within the chamber;
 admitting a gas containing molecules of a coating material into the chamber;
 maintaining the temperature of the substrate to less than 300° C.; and
 applying a D.C. voltage to the cathode causing a glow discharge at the exposed portion of the cathode, the flow of electrons during glow discharge reducing any positive charge accumulation at the substrate, thereby forming a coating on the substrate.

19. A method according to claim 18 wherein said step of admitting a gas comprises the step of admitting a hydrocarbon gas, the coating deposited being an infrared transparent hard carbon.

20. A method according to claim 18 wherein said step of admitting a gas comprises the step of admitting a silane gas, the coating deposited being a silicon.

21. A method according to claim 18 wherein said step of admitting a gas comprises the step of admitting a germane gas, the coating deposited being germanium.

22. A method according to claim 18 further including, before the step of maintaining, the step of heating the substrate.

23. A method according to claim 18 further including the step of cleaning the substrate by ion bombardment prior to applying the coating by glow discharge.

24. A method according to claim 23 wherein said cleaning step comprises the steps of:
- after substantially evacuating air from the chamber, introducing Argon gas into the chamber; and
- applying a D.C. voltage to the cathode causing initiation of a glow discharge at the exposed portion thereof.

25. A method according to claim 18 further including the steps of:
- evacuating the first gas from the chamber;
- introducing a second gas into the chamber containing molecules of a second coating material layer to be applied to the substrate;
- applying a D.C. voltage to the cathode causing a glow discharge at the exposed portion of the cathode, thereby forming a coating of the second material on the substrate.

* * * * *